(12) United States Patent
Carr (10) Patent No.: US 11,961,988 B1
(45) Date of Patent: Apr. 16, 2024

(54) HYBRID BATTERY SYSTEM COMPRISING A CONTINUOUS POWER SOURCE

(71) Applicant: William N. Carr, Gainesville, FL (US)

(72) Inventor: William N. Carr, Gainesville, FL (US)

( * ) Notice: Subject to any disclaimer, the term of this patent is extended or adjusted under 35 U.S.C. 154(b) by 0 days.

(21) Appl. No.: 18/202,493

(22) Filed: May 26, 2023

(51) Int. Cl.
| | |
|---|---|
| *H01M 12/02* | (2006.01) |
| *B82Y 30/00* | (2011.01) |
| *H01M 6/02* | (2006.01) |
| *H01M 50/509* | (2021.01) |
| *H01M 50/569* | (2021.01) |
| *H10N 10/01* | (2023.01) |
| *H10N 10/13* | (2023.01) |
| *H10N 10/82* | (2023.01) |
| *H10N 19/00* | (2023.01) |

(52) U.S. Cl.
CPC ............ *H01M 12/02* (2013.01); *B82Y 30/00* (2013.01); *H01M 6/02* (2013.01); *H01M 50/509* (2021.01); *H01M 50/569* (2021.01); *H10N 10/01* (2023.02); *H10N 10/13* (2023.02); *H10N 10/82* (2023.02); *H10N 19/00* (2023.02)

(58) Field of Classification Search
CPC ...... H01M 12/02; H01M 6/02; H01M 50/509; H01M 50/569; B82Y 30/00; H10N 10/01; H10N 10/13; H10N 10/82; H10N 19/00
See application file for complete search history.

(56) References Cited

U.S. PATENT DOCUMENTS

| | | | |
|---|---|---|---|
| 9,006,857 B1 | 4/2015 | Carr | |
| 9,236,552 B2 | 12/2016 | Carr | |
| 9,722,165 B2 | 1/2017 | Carr | |
| 10,281,333 B2 | 5/2019 | Takahashi et al. | |
| 10,890,489 B2 | 1/2021 | Tambo | |
| 11,193,904 B2 | 12/2021 | Carr | |
| 11,231,382 B2 | 1/2022 | Carr | |
| 11,300,453 B2 * | 4/2022 | Carr | ......................... G01J 3/36 |
| 11,309,473 B2 | 4/2022 | Carr | |
| 11,381,761 B2 | 7/2022 | Carr | |

FOREIGN PATENT DOCUMENTS

CN          104602484 A   *  5/2015

OTHER PUBLICATIONS

CN-104602484-A, Wang, Machine Translation (Year: 2015).*

* cited by examiner

*Primary Examiner* — Devina Pillay (57) ABSTRACT

A semiconductor-based battery system comprising a primary battery that spontaneously provides power that in embodiments trickle-charges a secondary battery. The battery obtains power as heat from the surrounding environment. The primary battery is powered through internal blackbody radiation, which cools a micro-platform and provides thermoelectric power at all temperatures above absolute zero with available power increasing with temperature. Lifetime of the primary battery is not limited by electrochemical degradation over time. In embodiments, the primary battery powers an application device directly without a secondary battery.

19 Claims, 12 Drawing Sheets

HYBRID BATTERY SYSTEM COMPRISING A CONTINUOUS POWER SOURCE

STATEMENT OF RELATED CASES

This application is a continuation in part of application Ser. No. 17/538,506 issued as U.S. Pat. No. 11,381,761 Jul. 5, 2022. This application is a continuation in part of Appl. No. PCT/US22-31635 filed May 31, 2022.

FIELD OF THE INVENTION

This invention relates generally to a semiconductor-based primary battery providing trickle charge for a secondary battery within a system.

BACKGROUND OF THE INVENTION

The subject invention comprises a 3-D micromachined MEMS structure based on deep-submicron foundry processing technology. The micromachined MEMS structure includes nanowires comprising phononic MEMS structure having an extremely low thermal conductivity. In this invention, a micro-platform suspended by thermal-isolating nanowires is positioned within a pixel, wherein the primary thermal energy transport affecting the temperature of the platform is Planckian blackbody photonic radiation. In the present invention, a suspended micro-platform is structured to maximize spontaneous blackbody radiance from the platform surface. The heat radiated from the platform is terminated external to the platform, and the platform is passively cooled.

A Seebeck thermoelectric thermocouple within each pixel senses the resulting temperature differential between the platform and the surrounding warmer heat sink to provide an electrical source of power. The platform and nanowires comprise a thermocouple with at least one couple disposed in the platform and the other couple disposed externally and maintained at heatsink temperature. In the present invention, the thermocouple voltage from a plurality of interconnected pixels is increased to a level that can power an application device such as a hearing aid.

Stefan and Boltzmann (circa 1879-1804) derived a detail equation known as the Boltzmann law which shows that the thermal radiance from any surface increases as the fourth power of temperature ($T^4$) referenced to absolute zero (−273° C.). More recently M. Planck in 1899 explained the Boltzmann equation with reference to quantum theory and created the basis for modern quantum physics.

The specific physical technology supporting the present invention is based on micromechanics and microengineering technology, better known as MEMS. MEMS has important applications across a broad range of micro/nano device technologies including the 3-D nano/micro devices of the present invention. The first modern MEMS device is disclosed by H. Nathanson and R. Wickstrom in U.S. Pat. No. 3,413,573, issued in 1968 as a resonant cantilever device comprising an actuated micro-cantilever modulating the transconductance of a MOSFET transistor.

Another actuated MEMS device comprising a SPST switch is actuated out-of-plane by a semiconductor thermal micro-heater actuated by an external source of heat. This was disclosed by W. Carr and X-Q Sun in U.S. Pat. No. 5,796,152 issued in 1998.

A MEMS device comprising bimorph cantilevers with actuation including an external blackbody infrared source is disclosed in M. Rinaldi et al in U.S. Pat. No. 10,643,810 issued in 2020. Actuation is based on heat absorbed into a bimorph cantilever wherein the source of heat is the external blackbody infrared emitter.

In 2022, prior art disclosing a MEMS micro-platform within a Seebeck thermocouple and cooled by the spontaneous blackbody radiation from the MEMS platform is based on thermostatic phononic structure that provides extreme thermal isolation of a micro-platform. This disclosure is published in three U.S. Pat. Nos. 11,231,382, 11,300,453 and 11,381,761 issued in 2022 with W. Carr as the listed inventor. Each of these three patents disclose a thermopile infrared detector wherein a Seebeck thermoelectric voltage created as the platform is spontaneously cooled by its own blackbody radiation. These patents are disclosed as an infrared detector wherein the detector structure comprising a spontaneously cooled platform is claimed to function as a primary battery.

Extreme thermal isolation of a platform with phononic MEMS structure is fundamental to the invention. A first patent disclosing a phononic MEMS device with phononic MEMS structure was issued to W. Carr, U.S. Pat. No. 9,006,857, issued Apr. 14, 2015.

Figure 1:
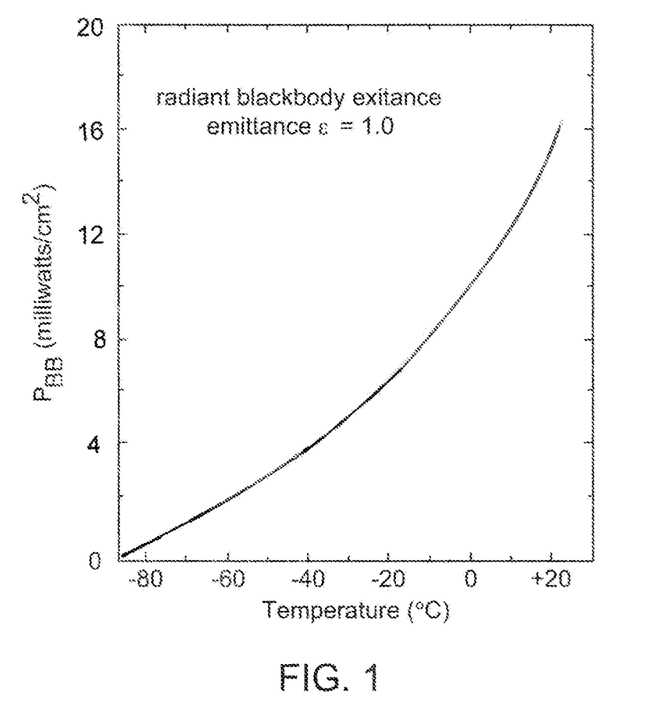
FIG. 1 is a graph of blackbody power radiated from a surface having emittance ε=1.0 within a limited wavelength range as a function of temperature

The potential for a micro-platform to cool itself by spontaneous blackbody radiation is limited by the radiant power $P_{BB}$ emitted from an emissive platform. FIG. 1 is a graph of blackbody radiance from a surface having an emissivity $\varepsilon=1$ as a function of temperatures near room temperature based on the Boltzmann law of blackbody radiance. FIG. 1 shows broadband infrared power available from blackbody radiance for conversion to electrical power within a primary battery comprising Seebeck thermocouples connected to a spontaneously cooled platform. zero.

Prior art listed above does not disclose a semiconductor-based primary battery configured integral with a secondary battery, wherein the primary battery comprising phononic MEMS structure provides trickle-charging current into a secondary battery. The primary battery power is derived from internal spontaneous blackbody radiance. A system that includes a semiconductor-based primary battery within an application system can provide a significant improvement in state-of-the art for small battery sources in addition to an almost unlimited primary battery lifetime.

SUMMARY OF THE INVENTION

The subject invention comprises a hybrid battery system (HBS) wherein an array of semiconductor pixels are configured to provide a primary battery packaged together with a secondary battery. The primary battery is comprised of an array of planer platforms suspended by phononic nanowires within a hermetic cavity. Each platform is cooled by spontaneous blackbody radiation, designated as "first radiation" emitted from one or more of its surfaces. The platform is configured to increase the first radiation.

Surfaces of the cavity walls surrounding the platform are exposed to the first radiation which cools the platform. The cavity walls are configured to reduce a blackbody "second radiation" which radiatively heats the platform. The cavity walls are configured to maximize absorption of the first radiation and minimize the second radiation.

In embodiments, the hybrid battery system includes an application electrical device.

The phononic nanowires comprise phononic MEMS structure including phononic crystal (PnC) metamaterial and/or randomly disposed phonon scattering structures, thereby reducing thermal conductivity of the nanowires. The phononic MEMS structures comprise crystalline or polycrystalline semiconductor, wherein structural elements are physically separated by less than the mean-free-path (mfp) of a least some heat conducting phonons. The phononic MEMS structure is configured to increase the ratio of electrical conductivity to thermal conductivity within the phononic nanowires Each platform within the array, together with its connecting nanowires, comprises a Seebeck thermocouple within an electrical circuit. In embodiments, the thermoelectric source provides a trickle-charging current into the secondary battery. In embodiments a voltage regulator maintains a constant voltage for the charge trickling into the secondary battery and powering an application device.

The phononic crystal (PnC) is structured with an orderly arrangement of PnC structural sites to provide a phononic bandgap which is a type of resonant structure. In other embodiments, the structural elements are disposed randomly on the nanowire surfaces, bulk, or edges.

The phononic MEMS structure comprises a semiconductor selected from the group including, without limitation, silicon, silicon germanium, vanadium oxide, silicon carbide, gallium nitride, and organic semiconductor.

The phononic MEMS structure comprises, without limitation, holes, vias, pillars, surface dots, a field of nanowires, plugs, cavities, indentations, surface particulates, roughened edges, implanted molecular species, porous structure, and molecular aggregates disposed in a periodic or random format.

In embodiments, a nanowire may be adapted to include a thin metal film providing increased electrical conductivity and/or static positioning of said nanowires.

In embodiments, a nanowire may be adapted to include a layer of dielectric material providing electrical isolation between nanowire layers and/or static positioning of said nanowires.

A planer surface of the platform may comprise, without limitation, carbon nanotubes (CNTs), graphene, silicon black, carbon black, or gold black providing a high emissivity for first radiation within a broad wavelength range.

The cavity walls are configured to reduce wall reflection and increase absorption of the first radiation incident from the platform.

In embodiments the cavity walls comprise resonant structures providing absorption of the first radiation with reduced second radiation over a broad infrared wavelength range.

The cavity is maintained in a vacuum condition, or backfilled with a gas of low thermal conductivity such as Ar, Xe, Kr providing an increase in thermal isolation for the platform. In embodiments, the cavity comprises a getter material for maintaining a low pressure environment within the cavity.

The pixels within the array of the primary battery are interconnected in a parallel/series combination circuit to provide a voltage suitable for trickle-charging the secondary battery.

In embodiments, the primary battery is formed of a multi-layer sandwich of semiconductor wafers bonded together to define a plurality of the cavities within each lateral plane. Each wafer is configured with a structure to control a component of the spontaneous blackbody radiation within each cavity.

In embodiments, a voltage regulator is connected between the primary and secondary battery to limit the full-charge voltage in the secondary battery.

In embodiments, the application device is connected to an application device within the system.

The secondary battery comprises one or more including, without limitation, lithium ion, lithium polymer, lead acid, NiCd, nickel metal-hydride types.

In another embodiment, the HBS is adapted to not include the secondary battery, wherein the primary battery provides adequate power for operation of the application device. In some applications, a capacitor having a large capacitance can replace the secondary battery for application devices with a low duty cycle where higher power is required only momentarily.

The platform is planer in structure and is characterized by an edge dimension ranging from 250 nanometers to multi-millimeters. The phononic nanowires are characterized by a thickness ranging from 10 nanometers up to around 1 millimeter.

The primary battery provides operation within a temperature ambient environment at temperatures as high as 1500° C. wherein the battery is comprised of a high temperature semiconductor such as SiC or GaN.

The primary battery is manufactured in a semiconductor foundry using standard wafer processing tools. The most readily available tools for processing the primary battery are available for silicon wafers.

DETAILED DESCRIPTION

Definitions: The following terms are explicitly defined for uses in this disclosure and the appended claims:

"primary battery" as used in this disclosure means a voltaic cell that is designed to provide trickle-charge current to an electrical load for a virtually unlimited time span.

"secondary battery" is a voltaic cell that can be electrically recharged after use to its original pre-discharge condition, by passing current through the cell in a direction opposite to the discharge current.

"radiance" and "radiation" as used in this disclosure mean the broadband photonic blackbody flux density emitted from, incident on, or absorbed into a surface.

"thermoelectric device" as used in technical disclosure means a semiconductor Seebeck junction device for conversion of thermal energy into electrical energy.

"black-body radiation" means the spontaneous thermal electromagnetic radiation within, or surrounding, a body in thermodynamic equilibrium with its environment.

"LED" means a light emitting diode comprising a semiconductor pn junction.

"LEP" means a light emitting platform comprising a heated blackbody radiator.

"plasmonic arc lamp" means a electric arc which creates a hot plasma in a gas such as Xe to produce light.

"surface plasmonic polariton" (SPP) means a surface electromagnetic waveguided-field along a metamaterial-patterned surface having sufficient electrical conductivity to support associated electron motion.

"phononic nanowire" means a suspended nanowire comprising phononic resonant or nonresonant elements providing a reduction in thermal conductivity.

"phononic crystal" (PnC) means specific metamaterial comprised of periodic nanostructure that reduces the thermal energy transport of phonons.

."MEMS" means a microelectromechanical system comprising 3-D structured components, generally processed from semiconductor wafers with integrated circuit fabrication tools.

"RFID receiver" or RFID tag" means a device controlled remotely, wherein control for the application device is obtained via a control signal transmitted from a remote interrogator.

"comprised" and "comprising" means at least partially formed of or including.

The nanowires comprise phononic MEMS structure to reduce thermal conductivity. This reduction in thermal conductivity is achieved by engineering the Brillouin zone to form phononic crystal (PnC) or randomly-disposed scattering structural elements. The effectiveness of physical decorations in the nanowires for reducing thermal conductivity is based on the duality principle in quantum mechanics stipulating that a phonon can exhibit both wave- and particle-like properties at nano-scales. The basic phononic MEMS structure comprises a crystalline or polycrystalline semiconductor, wherein structural elements are physically separated by less than the mean-free-path (mfp) of at least some heat conducting phonons.

Figure 2A:
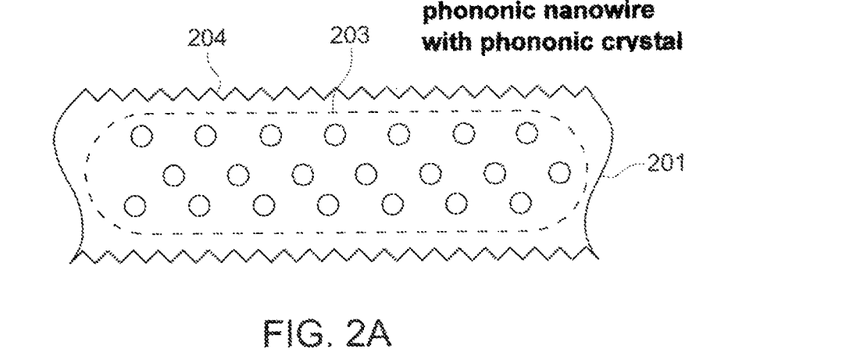
FIG. 2A depicts a plan view of a phononic nanowire comprising phononic crystal (PnC) structure.

FIG. 2A depicts a plan view of a phononic nanowire 201 comprising PnC with a "holey" structure 203. The PnC is characterized by a phononic bandgap which acts as a barrier to heat conducting phonons moving along the nanowire length. An example of PnC structures providing a reduction in thermal conductivity of a semiconductor thin film is in S. Mohammadi et al, Appl. Phys. Lett., vol. 92, 221905 (2008). PnC structuring of the Brillouin zone restricts phonon transport and increases thermal isolation of the platform.

The phononic MEMS structure comprises a crystalline or polycrystalline semiconductor, wherein structural elements are physically separated by less than the mean-free-path (mfp) of at least some heat conducting phonons. The phononic MEMS structure is primarily comprised of a semiconductor selected from the group, without limitation, comprising silicon, silicon germanium, vanadium oxide, silicon carbide, gallium nitride, and organic semiconductor.

Figure 2B:
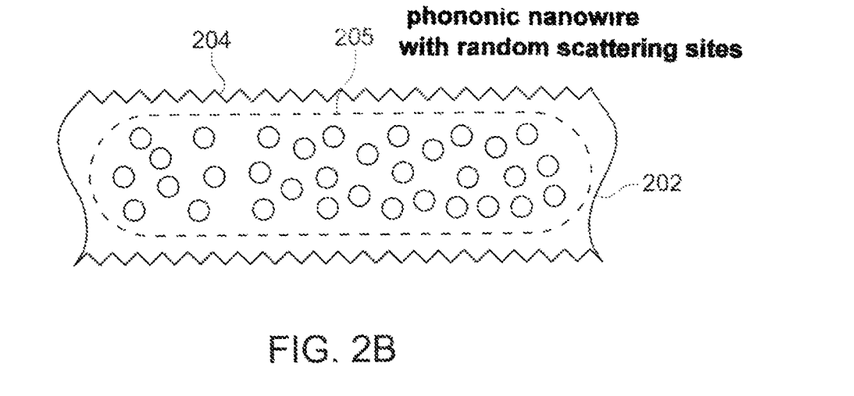
FIG. 2B depicts a plan view of a phononic nanowire comprised of random phonon scattering elements.

FIG. 2B depicts a plan view of a phononic nanowire 202 comprised of random phonon scattering elements 204, 205.

The phononic MEMS structure in FIGS. 2A, 2B may comprise, without limitation, holes, vias, pillars, surface dots, plugs, cavities, indentations, surface particulates, roughened edges, implanted molecular species, porous structure, and molecular aggregates. The phononic structure within the semiconductor nanowires increases the ratio of electrical conductivity to thermal conductivity.

Figure 3A:
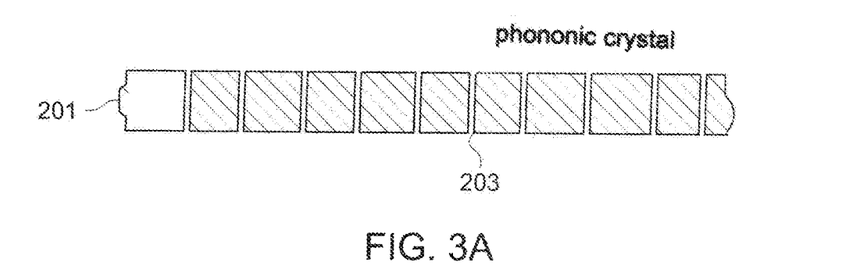
FIG. 3A depicts a cross-sectional view of a nanowire comprising (PnC) structure.
Figure 3B:
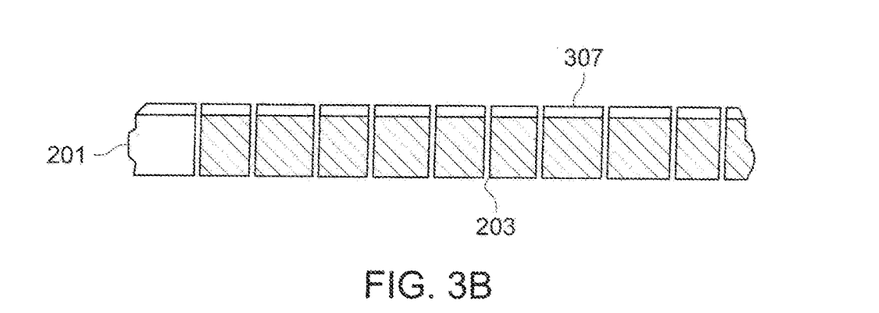
FIG. 3B depicts a cross-sectional view of a nanowire with a thin metal or conducting layer covering the phononic layer.
Figure 3C:
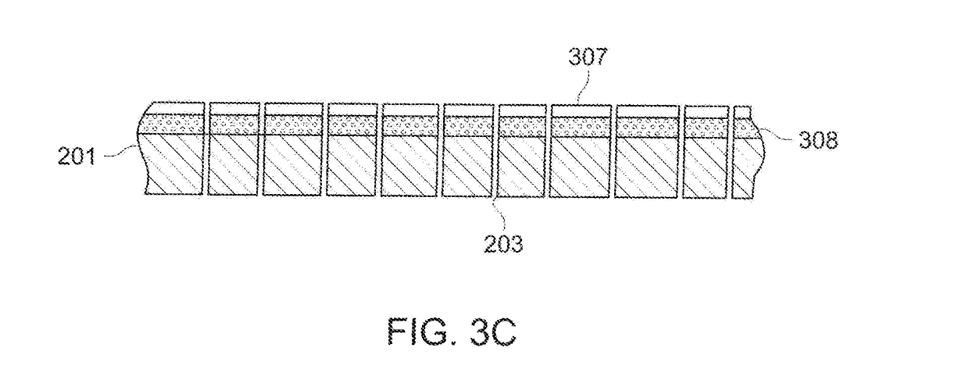
FIG. 3C depicts a cross-sectional view of a nanowire comprised of a dielectric and a conducting layer covering the phononic layer.

FIG. 3A depicts a cross-sectional view of nanowire comprising PnC "holey" structure 203. FIG. 3B depicts a cross-sectional view of a nanowire with a thin metal or other electrically-conducting layer 307 covering the phononic layer 201. This film increases the electrical conductivity of the nanowire. FIG. 3C depicts a cross-sectional view of a nanowire comprised of a dielectric layer 308 and a conducting layer 307 covering the thicker phononic layer 201. The dielectric layer provides electrical isolation between the metal and phononic MEMS layers of the nanowire, and/or static stress control affecting vertical static positioning of the platform.

Figure 4A:
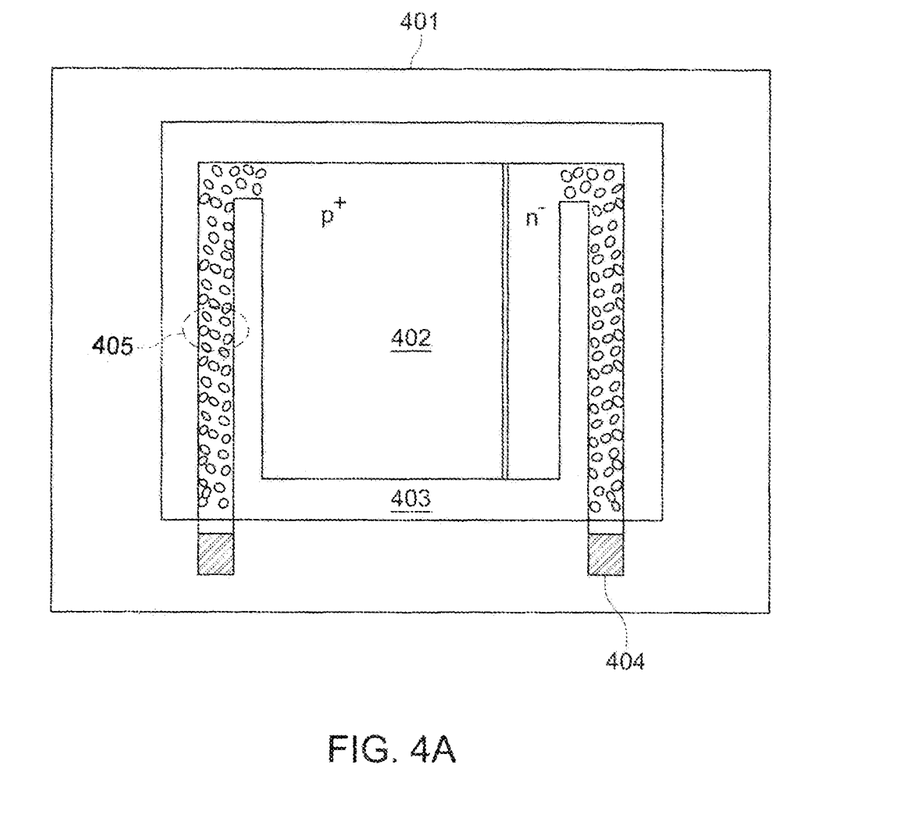
FIG. 4A depicts a plan view of a platform supported by two nanowires.
Figure 4B:
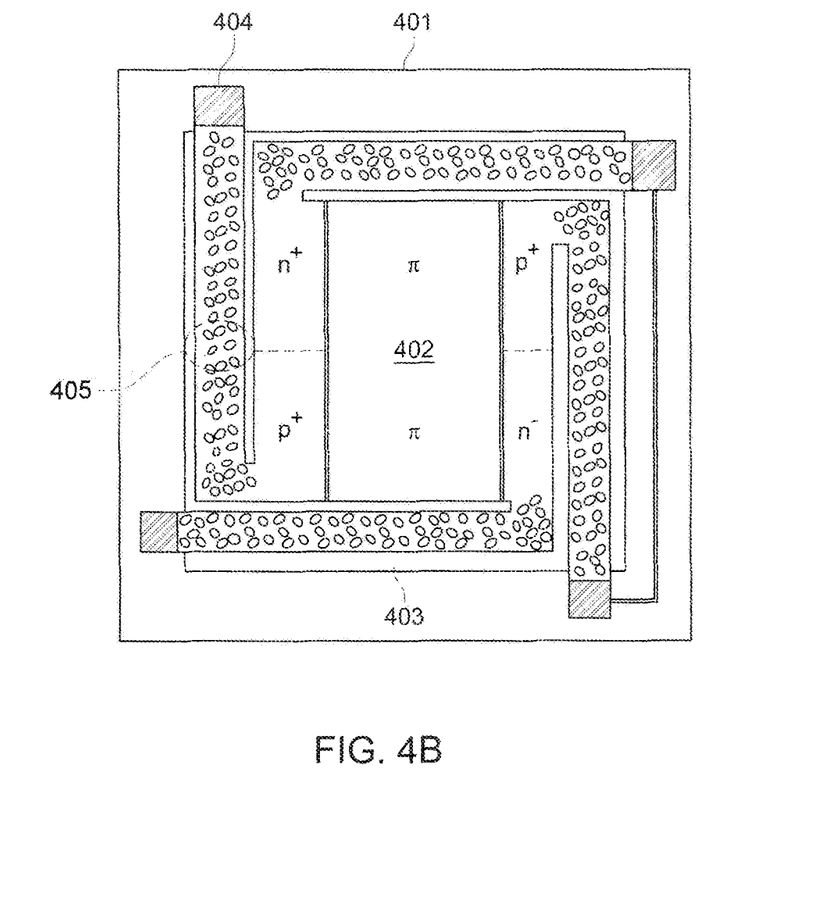
FIG. 4B depicts a plan view of a platform supported by four nanowires.

FIGS. 4A and 4B depict a plan view of a pixel comprising platform 402 suspended by nanowires 405 from a surrounding support structure 401 over cavity 403. The platforms comprise one or two thermocouples, wherein each thermocouple comprises a couple disposed on 'the platform and two nanowires tethered on the surrounding structure 401. The platforms of the FIGS. 4A and 4B comprise one and two couples, respectively. Each nanowire comprises a heavily doped p+ or n⁻ semiconductor as part of each thermocouple also physical support for released platforms 402. Each nanowire 407 is tethered with one end on bonding pads 404 providing electrical connection with the Seebeck thermocouples.

The platform and nanowires within each pixel of FIGS. 4A and 4B are released from an underlying platform using a chemical etch during the fabrication process thereby providing thermal isolation for each platform.

Figure 5:
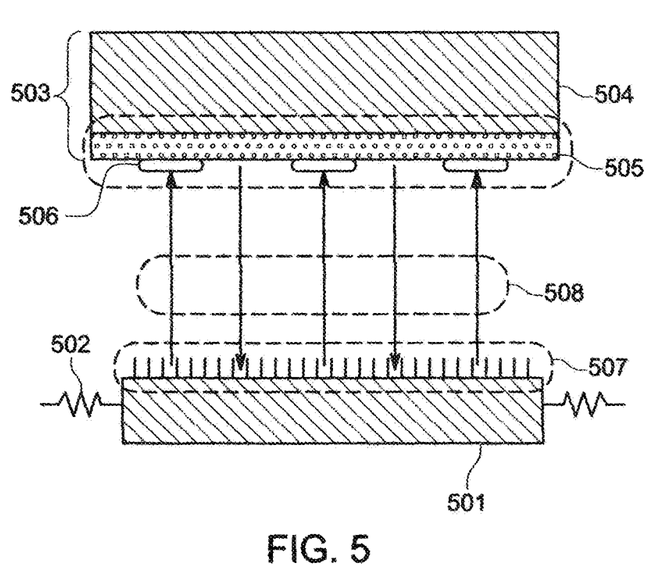
FIG. 5 depicts a plan view of the platform and adjacent cavity wall with blackbody radiance from both.

FIG. 5 depicts a plan view of an isothermal platform comprising substrate 501 and a surface structure 507 structured to provide a maximum first blackbody radiance over a broad bandwidth. The platform is supported with nanowires 502 within a cavity suspended from a surrounding pixel wafer structure. A topside bonded wafer 503 comprises second surface structure 505 comprised of patterned metal layer 506, dielectric layer 505 disposed on topside wafer structure 504. The topside wafer 503 is configured to minimize a second radiance or reflection directed toward the platform.

The platform is cooled by the first radiance and heated by any second radiance or reflection from the topside wafer. The thermal bi-directional energy transport comprising the first and second heat fluxes is depicted within the beam 508. A design goal is maximize the first radiance and minimized any thermal transport from the topside surface 505. In an ideal design, the thermal photonic energy transport 508 is unidirectional from the platform configured with a surface 507 having an infrared emissivity of I/O, thereby creating a maximum cooling of the isothermal platform.

In FIG. 5, the platform structure comprises one or more couples (not depicted in FIG. 5) sense the difference in temperature between the platform and the supporting substrate which is a heatsink, normally at room temperature. A Seebeck voltage is generated within each pixel proportional to the temperature difference between the platform couple or couples and the surrounding substrate heatsink. In a typical application, a plurality of platforms are connected in a series/parallel array connection providing a desired voltage delivering power to an electrical load external to the pixel array. The pixel array depicted in FIG. 5 comprises one form of a primary battery wherein only only one surface of the pixel platform provides significant radiance.

The surface structure 505 of the topside wafer 503 is configured to absorb broadband infrared radiation and reduce reflection of thermal energy back into the platform. A design of such a surface is disclosed in Z. Wang et al, MDPI Photonics, vol. 9, 9080574 (2022).

Figure 6:
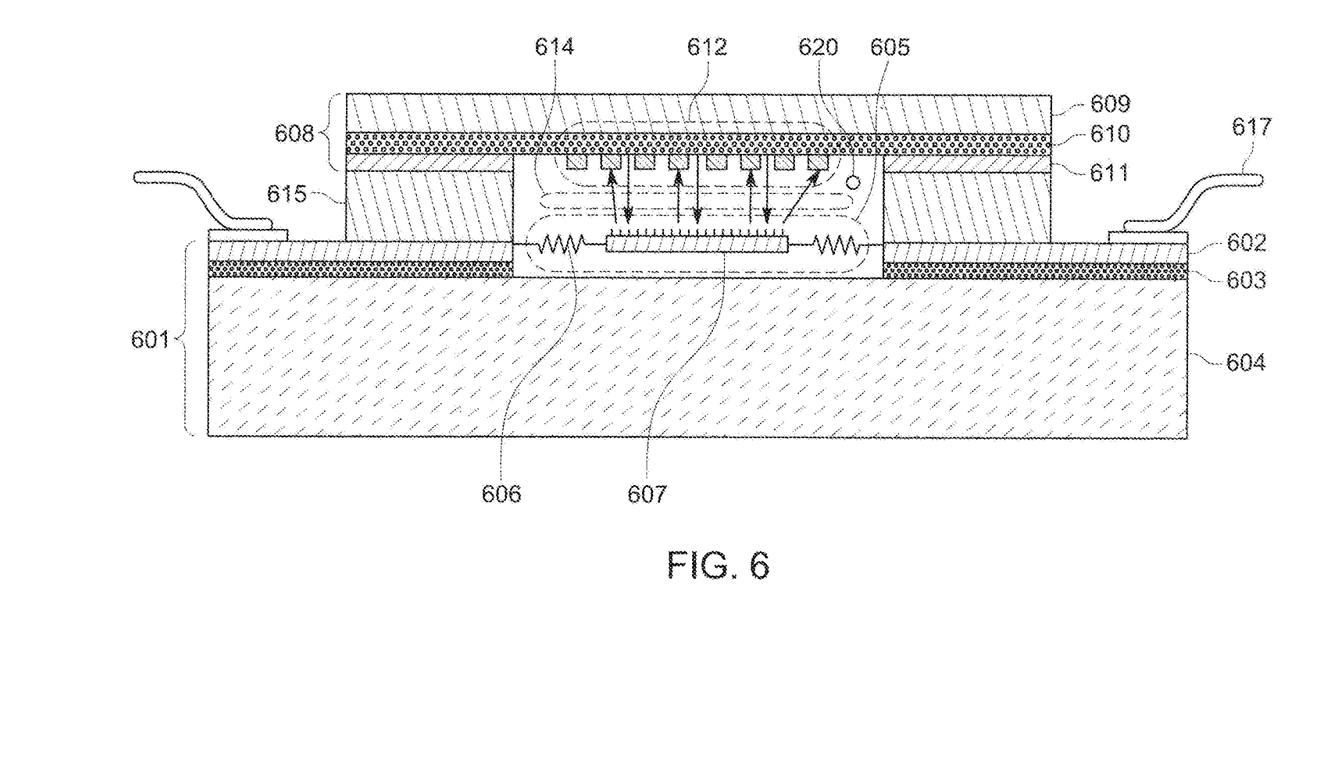
FIG. 6 depicts a cross-sectional view of a primary battery pixel with a decorated topside semiconductor seal creating a hermetic cavity.

FIG. 6 depicts an entire pixel comprising the platform 607 and the topside bonded wafer portion 503 from FIG. 5. FIG. 6 depicts a cross-sectional view of a primary battery pixel with a bonded topside semiconductor 608 comprising a substrate 609, dielectric film 610, and a patterned metallic layer 615. Structure 605 comprises the platform 607 and nanowires 606 suspended from surrounding wafer 601. Topside wafer 608 comprises semiconductor 611 and structures within the resonant photonic absorber 612. The platform 607 comprising a surface configured to enhance blackbody radiance and its supporting nanowires are sealed within hermetic cavity 620. A spacer layer 615 is bonded to increase the separation between the topside cavity-wall structures 612 and the platform 607.

Spacer layer 615 can be created as a patterned metallic or dielectric layer on starting wafer 601. The platform 607 with its nanowires 606 are released by a vapor HF etch from semiconductor wafer 601 comprised of a substrate 604, dielectric layer 603, and active semiconductor layer 602. Platform 605 and nanowires 606 comprise the active layer 603 of wafer 601. The cavity 620 is created by wafer bonding wafer 608 to wafer 601 in a vacuum environment to provide a lasting hermetic seal. Metal interconnect wires 617 are depicted as bonded to wafer 601

Platform 607 is cooled by the net of spontaneous cooling blackbody radiance from platform 607 and heated through conducted sources within the pixel which include potential spontaneous source 612. Other sources of heat into the platform 607 include heat conducted through nanowires from surrounding heatsinks 601,608, $I^2R$ heating from the nanowires 606 due to current I supplied to a load, and conducted/convected heat within cavity 620. In embodiments wherein thermal heating of the platform 607 is sufficiently reduced, the platform is spontaneously cooled below the temperature of isothermal heatsink 601, 608.

Depicted pixel wires 617 are connected with other pixels within an array to provide a series/parallel combination circuit. The resulting Seebeck thermoelectric voltage created in each pixel due to platform cooling provides power to trickle-charge a secondary battery or power a load application directly.

Figure 7:
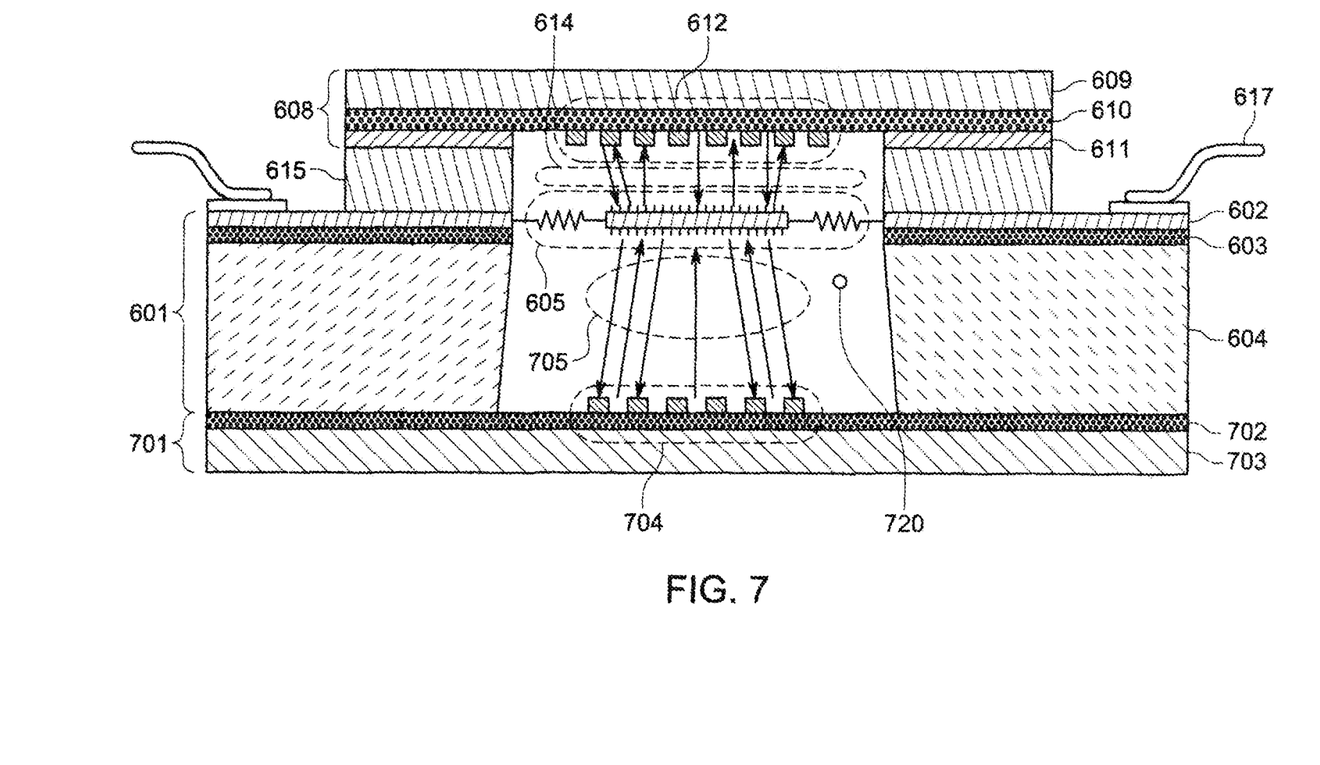
FIG. 7 depicts a cross-sectional view of a primary battery pixel with decorated topside and bottomside semiconductors creating a hermetic cavity wherein both cavity walls absorb radiance from the platform.

The primary battery pixel embodiment of FIG. 7 comprises both wafer 601 with its platform and nanowires 605, and bonded topside wafer 608, as depicted in FIG. 6 with one difference. The platform and nanowires of pixel 601 are released using a backside chemical etch instead of a topside chemical etch to increase cavity 720 volume. The increased cavity size permits growth of carbon nanotube or other structures with increased infrared emissivity into platform 605 backside as depicted in FIG. 7.

The expanded structure of FIG. 7 comprises a third wafer 701 bonded to the wafer combination of FIG. 6, wherein a structure 704 similar to the structure 612 of FIG. 6 is configured to absorb radiation and reduce reflection of the heat originating from the platform. Thermal transport from both surfaces is depicted as infrared beams 614,705. A third wafer 701 comprises dielectric layer 702 over rigid structure 703, and a patterned plasmonic film 704 exposed to platform 605 radiation.

The platform bottomside surface when configured with emissivity similar to the topside provides an approximate doubling of radiance for the entire platform. This doubling of platform radiance results in an approximate doubling of pixel voltage. Pixels of FIG. 7, interconnected with the same array circuit as the pixel of FIG. 6, further provide a primary battery wherein the terminal voltage is also doubled.

Figure 8A:
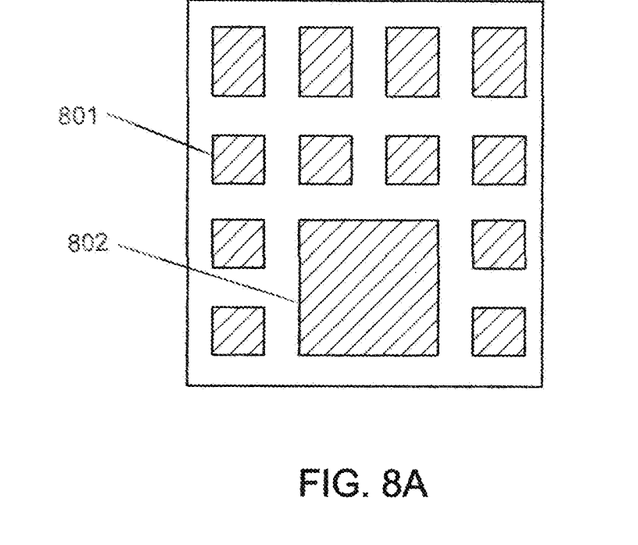
FIGS. 8A and 8B depict resonant structures disposed within both cavity walls providing broadband absorption with low emissivity for radiance from the platform.
Figure 8B:
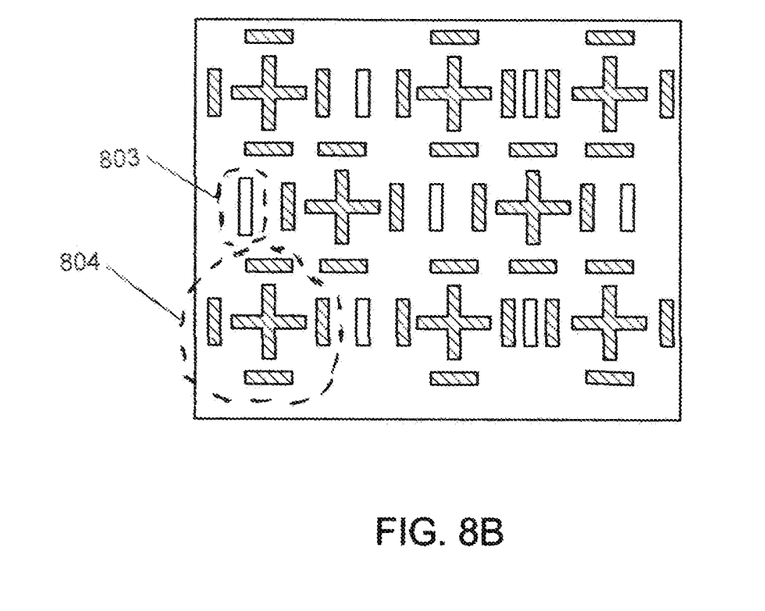

FIGS. 8A and 8B depict resonant absorption structures disposed within one or both cavity walls providing (1) broadband absorption of blackbody radiance from the thermoelectric platform, and (2) low emissivity or reflection of blackbody radiance to the platform. These absorbent structures, generally comprised of a of metal film, are examples of structures 505, 612 and 704 in pixels of FIGS. 5,6 and 7, respectively. These resonant structures provide absorption, low emissivity, and low reflectance over a broad wavelength range that includes the wavelength range of interest 5 to 16 micrometers.

FIG. 8A depicts a cavity surface providing two primary overlapping absorption resonances determined by plasmonic resonant structures 801, 802 disposed in array format. These structures may comprise metal or dielectric films over an underlying dielectric film.

FIG. 8B depicts a cavity surface providing absorption within a array of two resonant structures 803, 804 disposed in array format. Resonant structure 804 has an absorption wavelength associated with the metallic cross, and another resonant wavelength associated with the metallic bars surrounding the cross providing a net broadband absorption. Resonant structure 803 depicts a cutout into the cavity wall providing additional absorption. In other embodiments, resonant absorption is obtained with 3-D structure created into and disposed within the cavity walls.

FIGS. 8A and 8B are representative of a large variety of resonant structures that when disposed in close proximity in an array format provide the almost absolute absorption over the broadband wavelength band of interest centered around 10 micrometers wavelength.

Figure 9:
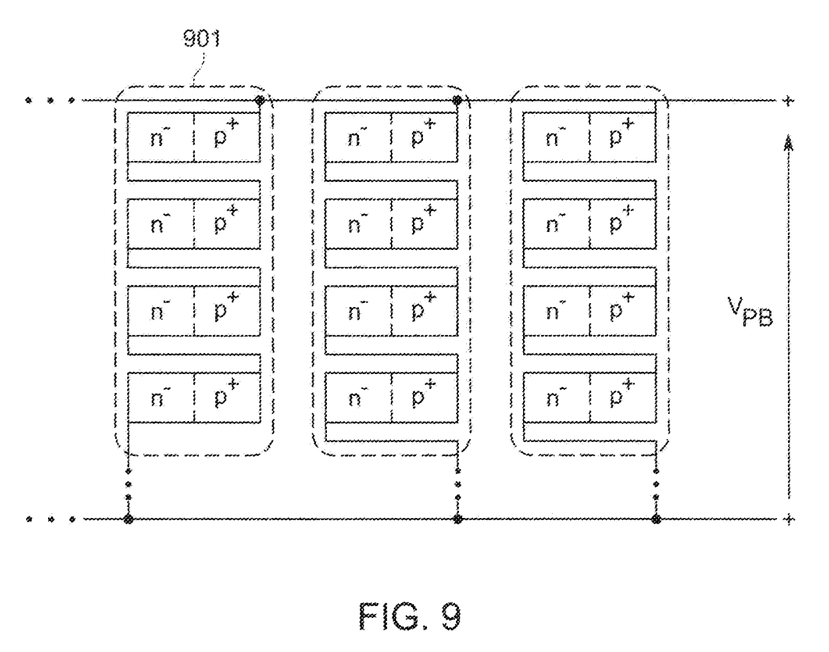
FIG. 9 is a circuit schematic illustrating a parallel/series connection of the platform within an array in the primary battery.

FIG. 9 is a circuit schematic depicting a parallel/series connection of multiple pixels in array format within the primary battery. The pixels can be interconnected with many circuit combinations. The example of FIG. 9 comprises three groups of series-connected pixels, each group providing a voltage at a useful level for trickle-charging a secondary battery or directly powering a load device. The number of series-connected pixels 901 determines the terminal voltage $V_{PB}$ of the battery, and the number of parallel-connected pixels determines the short-circuit current available to a load. The nominal primary battery voltage $V_{PB}$ can be set with series pixel circuits, and the maximum load current available is determined by the number of parallel circuits.

Figure 10:
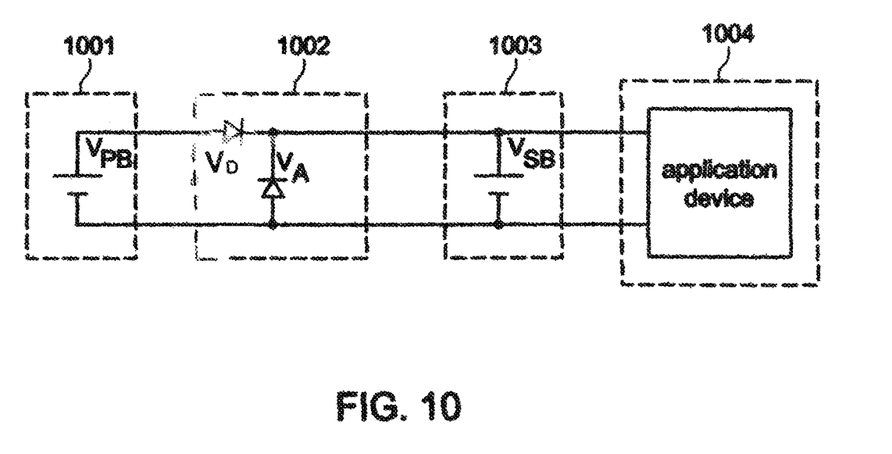
FIG. 10 is a schematic diagram depicting the HBS connected to an application device.

FIG. 10 is a schematic diagram depicting a battery system wherein a primary battery 1001 is connected to charge a secondary battery 1003 further connected to an application device 1004. Voltage regulator 1002 as depicted limits the maximum charging voltage into secondary battery 1003 with avalanche diode $V_A$. Diode $V_D$ in the voltage regulator 1002 prevents the primary battery 1001 from drawing power from the secondary battery $V_{SB}$ 1003. Other more complex voltage regular circuits may provide other desirable control features. In FIG. 10 application device 1004 is powered directly from the secondary battery $V_{SB}$ 1003.

Figure 11:
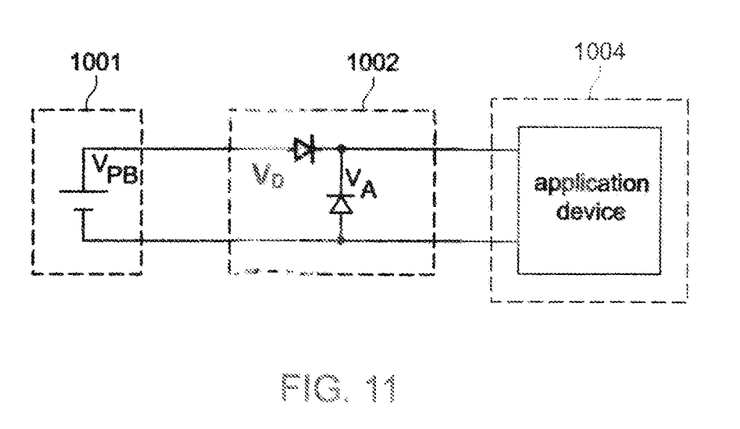
FIG. 11 is a schematic diagram depicting the HBS adapted without a secondary battery.

FIG. 11 is a schematic diagram a depicting the battery system without a secondary battery. The primary battery 1001 powers an application device 1004 directly through the voltage regulator 1002. In these embodiments, the primary battery 1001 provides sufficient electrical current to power an application device directly, and a secondary battery is not needed. The adaptation of FIG. 11 can be especially desirable as an implanted biomedical device and power source for wearable low power devices.

SYSTEM BIOMEDICAL APPLICATION DEVICES

In embodiments, the hybrid battery system HBS is integrated with a biomedical device. Non-limiting examples of such a biomedical device include a hearing aid, implanted heart pacer, and a wearable or implanted sensor for analyzing blood components (e.g., insulin, etc.). In such embodiments, the primary battery within the HBS may be integrated with a sensor/control circuit within a sealed, implantable enclosure.

Devices PERSONAL APPLICATION DEVICES

In some embodiments, the HBS is integrated with a personal application device, such as, without limitation, an infrared flashlight, a personal alarm, virtual reality eyeglasses (VRE), and a mobile phone.

REMOTE CONTROLLED DEVICES

In embodiments, the hybrid battery system HBS is integrated with a remote-controlled device, such as an LED, LEP, or laser photonic source. In embodiments, the HBS is integrated with other remote-controlled devices, such as an alarm system, electronic door lock, or toxic gas monitor. In embodiments, the HBS is integrated with yet still further remote-controlled devices, such as, without limitation, a microwave RFID radio receiver or RFID tag, wherein remote control is implemented through an electromagnetic interrogator.

The Primary Battery May be Connected Directly to an Application Device

In some embodiments, the HBS is configured with a micro-sized secondary battery, or without a secondary battery, wherein adequate power is provided from the primary battery directly to the application device. An example of this embodiment includes a modern hearing aid as the application device, wherein the semiconductor primary battery provides adequate power for continuous operation of the hearing aid. Other applications, wherein the primary battery can provide adequate power without a secondary battery, include implanted heart rate pacers, electronic wristwatches, and wall clocks.

Primary Battery Fabrication Detail

The fabrication process for manufacturing the primary battery involves fabricating a 3-dimensional MEMS structure with at least 2 bonded wafers to create the hermetic cavity and blackbody control structures depicted in FIG. 6.

A list of fabrication process steps for creating the primary battery with 3 bonded wafers as depicted in FIG. 7 is presented in chronological sequence as follows:

process starting wafer #1:
create the masks to define nanowire areas for selective diffusion or implant doping of the active layer of a silicon SOI wafer;
diffuse or implant nanowires to nanowires with high doping levels;
create a mask to define electrical array interconnections with sputtered metalization;
create a patterned ALD catalytic film to define a growth area for carbon nanotubes (CNTs) on at least one side of the platform to increase spontaneous blackbody radiance;
create phononic crystal PnC within the nanowires with lithographic masks or e-beam micromachining;
grow vertical wall CNTs on at least one surface of the platform to enhance spontaneous blackbody emissivity from each platform;
release the platform and nanowire in each pixel from the surrounding wafer area using a vapor-assisted HF etch;

process wafers #2 and #3 separately:
pattern wafer2 and wafer3 in selected cavity wall areas with plasmonic metamaterial to provide increased broadband absorbance;
metamaterial to reduce infrared reflectance.
bond the topside of wafer1 to wafer2 and bond the bottomside of wafer1 to wafer3 alignment mated to define the hermetic cavities;

wafer bonding
bond wafer1 to wafer2
bond wafers ½ to wafer3

Packaging
process the 3-wafer stack with process steps including dicing, wire bonding, and final packaging to provide a plurality of primary batteries.

It is to be understood that although the disclosure teaches many examples of embodiments in accordance with the present teachings, many additional variations of the invention can easily be devised by those skilled in the art after reading this disclosure. As a consequence, the scope of the present invention is to be determined by the following claims.

What is claimed is:

1. A hybrid battery system (HBS) comprising a Seebeck thermoelectric primary battery, wherein the primary battery is comprised of an array of planar platforms, each platform is disposed within a hermetic cavity, each platform is suspended by phononic nanowires forming a pixel within the hermetic cavity, each platform is cooled by a spontaneous blackbody first radiation emitted from its surfaces, and further wherein:

at least one surface of each platform is configured to increase a first radiation;
at least one hermetic cavity wall surface exposed to the first radiation is configured to increase absorptivity of the first radiation without reflection;
the at least one surface of the hermetic cavity walls exposed to the platform is configured to minimize emission of blackbody second radiation;
the phononic nanowires comprise phononic microelectromechanical system (MEMS) structure including phononic crystal (PnC) metamaterial and/or randomly disposed phonon scattering structures, thereby reducing thermal conductivity of the nanowires;

the phononic MEMS structure comprises a crystalline or polycrystalline semiconductor, wherein structural elements of the phononic MEMS structure are physically separated by less than the mean-free-path (mfp) of at least some heat conducting phonons;

the phononic MEMS structure increases the ratio of electrical conductivity to thermal conductivity within the phononic nanowires; and the array of planar pixels comprises the Seebeck thermoelectric primary battery providing power for an application electrical device, and wherein the primary battery is formed of a multi-layer sandwich of semiconductor chips or wafers bonded together to define a plurality of the hermetic cavities within a lateral plane, wherein each chip or wafer is configured with structure to control a component of spontaneous blackbody radiation within each hermetic cavity.

2. The HBS of claim 1 wherein the phononic crystal (PnC) is structured to provide a phononic bandgap, and PnC structural sites are disposed in an orderly fashion.

3. The HBS of claim 1 wherein the phonon scattering structures are randomly disposed in the surface, bulk, or edge of the phononic nanowires.

4. The HBS of claim 1 wherein the phononic MEMS structure comprises a semiconductor material selected from the group including, without limitation, silicon, silicon germanium, vanadium oxide, silicon carbide, gallium nitride, and organic semiconductor.

5. The HBS of claim 1 wherein the phononic MEMS structure comprises, without limitation, holes, vias, pillars, surface dots, a field of nanowires, plugs, cavities, indentations, surface particulates, roughened edges, implanted molecular species, porous structure, and molecular aggregates disposed in a periodic or random format.

6. The HBS of claim 1 wherein some of the phononic nanowires are adapted to include a thin metal film providing increased electrical conductivity and/or static positioning of said nanowires.

7. The HBS of claim 1 wherein some of the phononic nanowires are adapted to include a layer of dielectric material providing electrical isolation between nanowire layers and/or static positioning of said nanowires.

8. The HBS of claim 1 wherein one or more planer surfaces of the platform comprise, without limitation, carbon nanotubes (CNTs), graphene, silicon black, carbon black, or gold black providing a high emissivity for first radiation within a broad wavelength range.

9. The HBS of claim 1 wherein the inner hermetic cavity walls are configured to reduce reflection and increase absorption of the first radiation incident from the platform.

10. The HBS of claim 1 wherein the inner hermetic cavity walls comprise resonant structures providing absorption of the first radiation with reduced second radiation over a broad infrared wavelength range.

11. The HBS of claim 1 wherein the cavity is maintained in a vacuum condition, or backfilled with a gas of low thermal conductivity such as Ar, Xe, Kr providing an increase in thermal isolation for the platform.

12. The HBS of claim 11 wherein the hermetic cavity comprises a getter material for maintaining a low pressure environment within the hermetic cavity.

13. The HBS of claim 1 wherein the Seebeck thermoelectric primary battery comprises thermocouples that are connected as a parallel/series combinational circuit providing voltage level suitable for being adapted to providing a trickle-charge to a secondary battery.

14. The HBS of claim 1 wherein a voltage regulator is adapted to be electrically connected between the primary and a secondary battery.

15. The HBS of claim 1 wherein the electrical device comprises, without limitation, one or more of a biomedical device, including a hearing aid, heart pacer, or wearable sensor for analyzing blood components.

16. The HBS of claim 1 wherein the electrical device comprises one or more of, without limitation, an alarm system, flashlight, outdoor floodlight, wristwatch, electronic door lock, toxic gas monitor, virtual reality eyeglasses (VRE), or mobile phone.

17. The HBS of claim 1 wherein the primary battery provides operation within a temperature ambient environment at temperatures as high as 1500° C. and the battery is comprised of a high temperature semiconductor such as SiC or GaN.

18. The HBS of claim 1 wherein each platform is formed with a lateral edge dimension ranging from 250 nanometers to multi-millimeters.

19. The HBS of claim 1 wherein the phononic nanowires are formed with a thickness ranging from 10 nanometers to 1 micrometer.

* * * * *